United States Patent
Su

(10) Patent No.: US 12,308,246 B1
(45) Date of Patent: May 20, 2025

(54) METHOD FOR MANUFACTURING SEMICONDUCTOR DEVICE

(71) Applicant: SwaySure Technology Co., Ltd., Shenzhen (CN)

(72) Inventor: Mao-Hua Su, Shenzhen (CN)

(73) Assignee: SWAYSURE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 19/047,173

(22) Filed: Feb. 6, 2025

(30) Foreign Application Priority Data

Mar. 5, 2024 (CN) .......................... 202410251821.6

(51) Int. Cl.
*H01L 21/311* (2006.01)

(52) U.S. Cl.
CPC ... *H01L 21/31144* (2013.01); *H01L 21/31111* (2013.01)

(58) Field of Classification Search
CPC .................. H01L 21/31144; H01L 21/31111
See application file for complete search history.

(56) References Cited

U.S. PATENT DOCUMENTS

| | | | |
|---|---|---|---|
| 6,368,982 B1 | 4/2002 | Yu | |
| 2020/0126996 A1* | 4/2020 | Panda | H01L 21/32139 |
| 2024/0145245 A1* | 5/2024 | Lin | C23C 16/403 |
| 2024/0203984 A1* | 6/2024 | Fan | H10D 30/6757 |

FOREIGN PATENT DOCUMENTS

| | | |
|---|---|---|
| CN | 101271828 | 9/2008 |
| CN | 101743626 | 6/2010 |
| CN | 103794547 | 5/2014 |
| CN | 116884916 | 10/2023 |

OTHER PUBLICATIONS

CNIPA, First Office Action for CN Application No. 202410251821. 6, Apr. 16, 2024.
CNIPA, Notice of Grant of Invention Patent Right for CN Application No. 202410251821.6, Apr. 30, 2024.

* cited by examiner

*Primary Examiner* — Zandra V Smith
*Assistant Examiner* — Andre C Stevenson
(74) *Attorney, Agent, or Firm* — Hodgson Russ LLP

(57) ABSTRACT

A method for manufacturing a semiconductor device includes: forming, on a substrate, a pair of film layers stacked in a vertical direction to form a stack structure, the pair of film layers includes a first material layer and a second material layer sequentially stacked in the vertical direction, the first material layer is an isolation material layer, and the second material layer is a sacrificial material layer or a conductive material layer; forming a patterned first hardmask on a side of the stack structure away from the substrate, the material of the first hardmask including aluminum oxide or titanium nitride; and etching the stack structure by using the patterned first hardmask as a mask to form an opening that penetrates through the stack structure.

7 Claims, 5 Drawing Sheets

METHOD FOR MANUFACTURING SEMICONDUCTOR DEVICE

CROSS-REFERENCE TO RELATED APPLICATIONS

This application claims priority to Chinese Patent Application No. 202410251821.6, filed on Mar. 5, 2024, the entire disclosure of which is hereby incorporated herein by reference.

TECHNICAL FIELD

The present application pertains to the technical field of semiconductors, in particular to a method for manufacturing a semiconductor device.

BACKGROUND

In a two-dimensional (2D) semiconductor device, components are arranged on a plane, and as the density of the components increases, the critical dimension of component units gradually decreases, resulting in a significant increase in the manufacturing costs and difficulty for manufacturing a high-density semiconductor device. In a three-dimensional (3D) semiconductor device, multiple layers of components are vertically stacked, and under the condition that feature sizes of the component units are the same, the three-dimensional semiconductor device can have a greater component density compared with a two-dimensional semiconductor device.

A three-dimensional semiconductor device generally uses a stack structure, for example, sequentially stacking a plurality of isolation layers and conductor layers. Openings, for example, through holes, penetrating through the isolation layers and the conductor layers need to be provided on the stack structure, so as to form an electrical or insulating structure at the through holes in a subsequent manufacturing process. The stack structure includes a plurality of isolation layers and conductor layers, and the through holes are formed using deep-hole etching, in which a hardmask needs to be used to protect a region except the through holes.

The hardmask includes carbon-based hardmasks such as Diamond-like Carbon (DLC), and Advanced Patterning Film (APF). At present, fluorine-based plasma etching is used to form through holes. A carbon-based hardmask has a relatively low selectivity for such etching, which tends to cause damage to a top conductor layer and isolation layer, such that the etching profile is not collimated, thereby limiting the number of stacked layers of the isolation layers and the conductor layers in the stack structure, and causing difficulty in further improving the component density of a three-dimensional semiconductor device.

SUMMARY

There is provided a method for manufacturing a semiconductor device according to embodiments of the present application. The technical solution is as below:

According to a first aspect of embodiments of the present application, there is provided a method for manufacturing a semiconductor device, including:

forming, on a substrate, a pair of film layers stacked in a vertical direction to form a stack structure, the pair of film layers includes a first material layer and a second material layer sequentially stacked in the vertical direction, the first material layer is an isolation material layer, and the second material layer is a sacrificial material layer or a conductive material layer;

forming a patterned first hardmask on a side of the stack structure away from the substrate, the material of the first hardmask includes aluminum oxide or titanium nitride; and etching the stack structure by using the patterned first hardmask as a mask, to form an opening that penetrates through the stack structure.

Other features and advantages of the present application may become obvious from the following detailed description, or may be learned, in part, by practice of the present application.

It should be understood that the foregoing general description and the following detailed description are exemplary and explanatory only and are not intended to limit the present disclosure.

BRIEF DESCRIPTION OF DRAWINGS

The accompanying drawings, which are incorporated herein and form a part of the description, illustrate embodiments consistent with the present application and together with the description, serve to explain the principles of the present application. Obviously, the accompanying drawings in the following description show merely some embodiments of the present application, and those of ordinary skill in the art may still derive other drawings from these accompanying drawings without inventive efforts.

DESCRIPTION OF THE EMBODIMENTS

Figure 1:
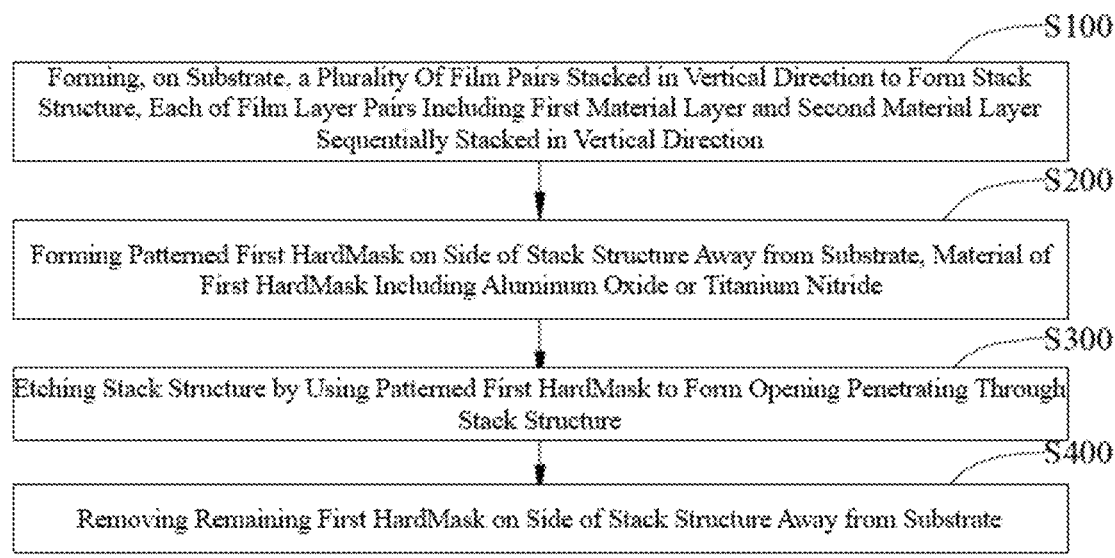
FIG. 1 is a flowchart of a method for manufacturing a semiconductor device according to embodiments of the present application.
Figure 2:
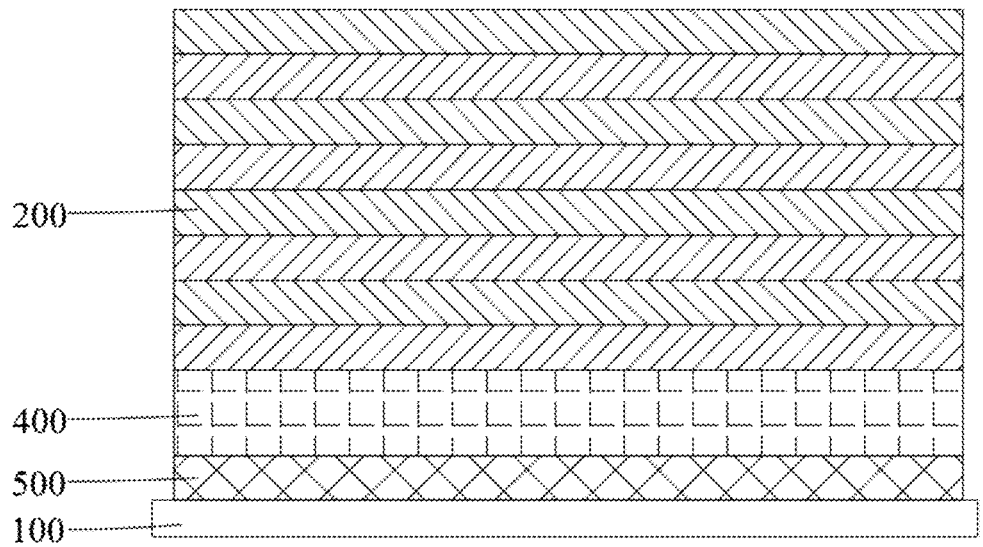
FIG. 2 is a schematic diagram of forming a stack structure according to the embodiments of the present application.
Figure 3:
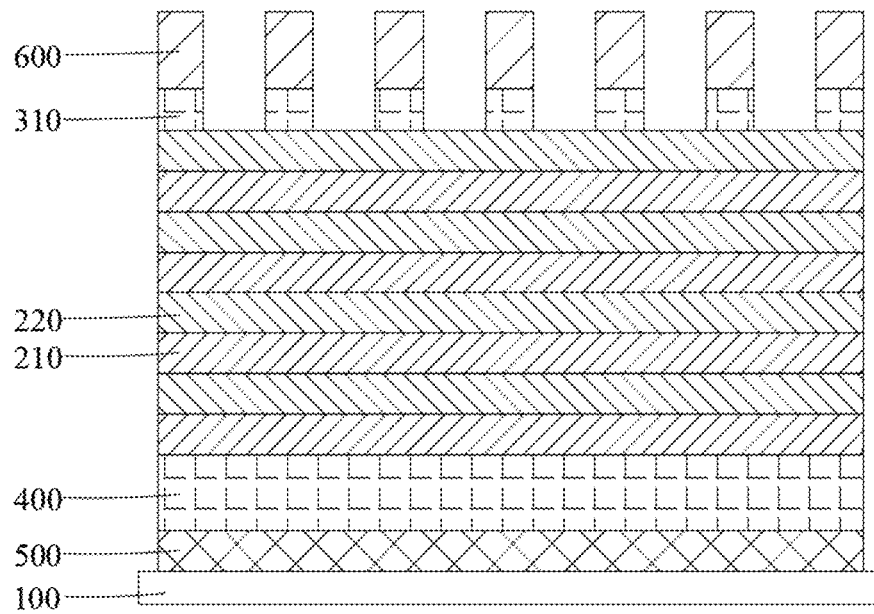
FIG. 3 is a schematic diagram of forming a first hardmask according to the embodiments of the present application.
Figure 4:
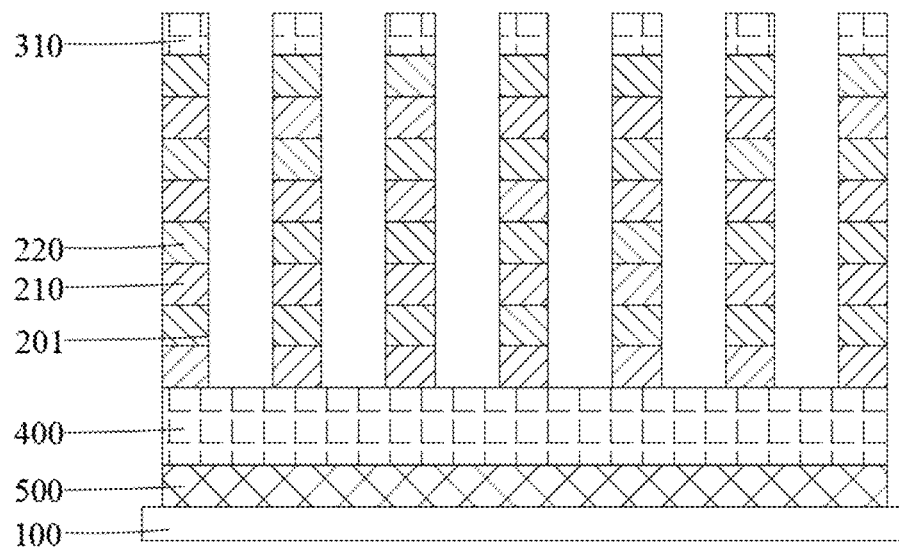
FIG. 4 is a schematic diagram of forming opening in a stack structure according to the embodiments of the present application.

Exemplary embodiments will now be described more fully with reference to the accompanying drawings. The exemplary embodiments may, however, be embodied in many different forms and should not be understood as limits to the examples described herein; instead, these embodiments are provided so that the present application will be thorough and complete, and the concept of exemplary embodiments will be fully conveyed to those skilled in the art.

Further, the described features, structures or characteristics may be incorporated in any suitable manner in one or more embodiments. In the following description many specific details are provided to give a full understanding of the embodiments of the present application. However, those skilled in the art will appreciate that the technical aspects of the present application may be practiced without one or more of the specific details, or other methods, components, devices, steps and the like may be employed. In other instances, the common methods, devices, implementations or operations are not shown or described in detail to avoid obscuring aspects of the present application.

The present application is described in further detail below in conjunction with the accompanying drawings and specific embodiments. It should be noted that the technical features involved in the different embodiments of the present application described below can be combined mutually in case of no conflict. The following embodiments described with reference to the drawings are illustrative and only used to explain the present application, but may not be interpreted as the restrictions of the present application.

Referring to FIG. 1 to FIG. 4, in the present embodiment, a method for manufacturing a semiconductor device includes:

S100: forming, on a substrate 100, a plurality of a pair of film layers stacked in a vertical direction to form a stack structure 200, the pair of film layers including a first material layer 210 and a second material layer 220 stacked sequentially in the vertical direction. The first material layer 210 is an isolation material layer, and the second material layer 220 is a sacrificial material layer or a conductive material layer.

The first material layer 210 and the second material layer 220 are stacked in the vertical direction, and in each film layer pair, the first material layer 210 is formed and then the second material layer 220 can be formed, or the second material layer 220 is formed and then the first material layer 210 can be formed, depending on specific situations. The material of first material layer 210 is different from the material of second material layer 220. The material of the first material layer 210 includes silicon oxide, silicon nitride or silicon oxynitride, the second material layer 220 is a sacrificial material layer or a conductive material layer, the material of the sacrificial material layer includes, for example, polysilicon or silicon nitride, and the material of the conductive material layer includes, for example, metal tungsten (W) or doped polysilicon.

S200: Forming a patterned hardmask structure on a side of the stack structure 200 away from the substrate 100, the step of forming the hardmask structure including forming a patterned first hardmask 310, the material of the first hardmask 310 including aluminum oxide ($Al_2O_3$) or titanium nitride (TiN).

As an example, the material of the first hardmask 310 is aluminum oxide, the first hardmask 310 may be formed on a side of the stack structure 200 away from the substrate 100 first, the first hardmask 310 may be formed by atomic layer deposition (ALD), and then the first hardmask 310 is etched to form the patterned first hardmask 310. The first hardmask 310 may also be manufactured by using other processes well known in the art. The first hardmask 310 may be etched by using a dry etching approach or a wet etching approach. Etching gases used in the dry etching approach include, for example, boron trichloride ($BCl_3$) and chlorine ($Cl_2$), depending on specific situations.

It should be understood that, the material of the first hardmask 310 includes, but is not limited to, aluminum oxide or titanium nitride, and the first hardmask 310 may also be a material having a higher etching selection ratio for the stack structure 200, depending on specific situations.

S300: Etching the stack structure 200 by using the patterned first hardmask 310 as a mask to form an opening 201 that penetrates through the stack structure 200.

The stack structure 200 can be etched by using a dry etching approach. For example, when the material of the first material layer 210 includes silicon oxide and the material of the second material layer 220 is metal tungsten, the etching approach may be fluorine-based plasma etching.

In some technical solutions, a carbon-based hardmask is used for the first hardmask 310, and the selection of the carbon-based hardmask for fluorine-based plasma etching is relatively low, that is, the carbon-based hardmask may be subjected to a loss due to etching when the stack structure 200 is etched, and in particular, the carbon-based hardmask at the patterned opening, i.e. the top at the edge, is subjected to a larger etching loss with respect to other parts. With the proceeding of etching and the increase of the etching depth, the morphology at the patterned opening of the carbon-based hardmask is greatly changed or even the pattern is deformed, thereby easily causing damage to the first material layer 210 or the second material layer 220 at the top of the stack structure 200, limiting the number of stacked layers of the material layers in the stack structure 200, and making it difficult to further improve the component density of a three-dimensional semiconductor device.

In this embodiment, the method for manufacturing a semiconductor device includes: forming, on a substrate 100, a plurality of film pairs stacked in a vertical direction to form a stack structure 200, in which each of the film pairs includes a first material layer 210 and a second material layer 220 sequentially stacked in the vertical direction, the first material layer 210 is an isolation material layer, and the second material layer 220 is a sacrificial material layer or a conductive material layer, forming a patterned first hardmask 310 on a side of the stack structure 200 away from the substrate 100, the material of the first hardmask 310 including aluminum oxide or titanium nitride, and etching the stack structure 200 by using the patterned first hardmask 310 as a mask, so as to form an opening 201 that penetrates through the stack structure 200. Compared with a carbon-based hardmask, the first hardmask 310 made of aluminum oxide or titanium nitride has a higher etching selection ratio for the stack structure 200, such that the problem of damage to the first material layer 210 or the second material layer 220 on the top of the stack structure 200 resulting in the limited number of stacked layers of the material layers in the stack structure 200 can be avoided, reducing the difficulty of increasing the component density of a three-dimensional semiconductor device.

Even if the first hardmask 310 has a very high etching selectivity for the stack structure 200, the first hardmask 310 may still be partially lost during the dry etching process, that is, after the etching ends, the first hardmask 310 in step S200 is formed as the remaining first hardmask 310. It can be understood that the loss of the first hardmask 310 may be much less than the loss of the carbon-based hardmask when the opening 201 penetrating through the stack structure 200 is formed by etching the stack structure 200 using the carbon-based hardmask, that is, compared with the use of the carbon-based hardmask, the use of the first hardmask 310 improves the resistance of the hardmask to etching, reduces the thickness of the hardmask and the degree of change of the pattern before and after etching, and thus is suitable for etching a pattern with a higher depth-to-width ratio, avoiding the limited number of stacked layers of material layers in the stack structure 200, and reducing the difficulty of increasing the component density of a three-dimensional semiconductor device.

In addition, when the first hardmask 310 is a carbon-based hardmask, a large amount of etching by-products may be generated in the etching process, resulting in a severe inclined profile, which may further cause the curved top side walls of the patterned opening. In this embodiment, the material of the first hardmask 310 includes aluminum oxide or titanium nitride, which reduces by-products in the etching process and can form more collimated openings 201 of the stack structure 200, and can further reduce the source of contaminants and improve the yield of the semiconductor device.

As shown in FIG. 1 to FIG. 5, the method for manufacturing the semiconductor device further includes:

S400: removing the remaining first hardmask 310 on the side of the stack structure 200 away from the substrate 100.

After forming the opening 201 that penetrates through the stack structure 200, the remaining first hardmask 310 on the side of the stack structure 200 away from the substrate 100 is removed, so as to prevent the remaining first hardmask 310 from affecting other structure arrangements on the side of the stack structure 200 away from the substrate 100.

Figure 5:
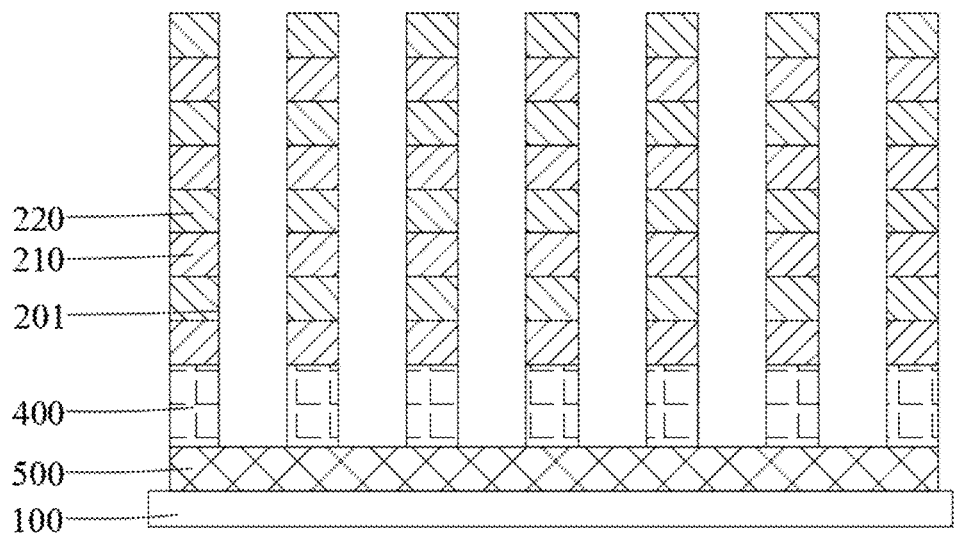
FIG. 5 is a schematic diagram of forming opening extending to penetrate through an etch stop layer according to the embodiments of the present application.

Referring to FIG. 5, the method for manufacturing a semiconductor device further includes:

before forming the stack structure 200, forming an etch stop layer 400 on the substrate 100, the stack structure 200 being formed on a side of the etch stop layer 400 away from the substrate 100.

When the opening 201 that penetrates through the stack structure 200 are formed, the opening 201 stops at the upper surface of the etch stop layer 400, or extend partially into a certain depth of the etch stop layer 400, but do not penetrate through the etch stop layer 400.

After forming the opening 201 that penetrates through the stack structure 200, the etch stop layer 400 extends the opening 201 to penetrate through the etch stop layer 400.

An etch stop layer 400 is provided between the substrate 100 and the stack structure 200, and when the stack structure 200 is etched, the opening 201 penetrates through the stack structure 200 and can stop at the etch stop layer 400, thereby avoiding damage to film layers under the etch stop layer 400 due to over etching. A circuit structure layer 500 can also be provided on the substrate 100 under the etch stop layer 400, and the etch stop layer 400 at the bottom of the opening 201 is etched, such that the opening 201 extends to penetrate through the etch stop layer 400, and thus the opening 201 can communicate with the circuit structure layer 500. The circuit structure layer 500 may include a drive circuit or wiring, etc.

In some implementations, the material of the etch stop layer 400 includes aluminum oxide or titanium nitride. It should be noted that, both the material of the first hardmask 310 and the material of the etch stop layer 400 include aluminum oxide or titanium nitride. The material of the first hardmask 310 and the material of the etch stop layer 400 may be the same or different.

The material of the etch stop layer 400 is the same as that of the first hardmask 310, which can reduce the process steps for manufacturing a semiconductor device and reduce the costs for manufacturing the semiconductor device.

When the material of the etch stop layer 400 and the material of the first hardmask 310 are the same, the method for removing the remaining first hardmask 310 on the side of the stack structure 200 away from the substrate 100 includes:

etching an etch stop layer 400 at the bottom of the opening 201 of the stack structure 200, extending the opening 201 of the stack structure 200 to penetrate through the etch stop layer 400, and removing the remaining first hardmask 310 on the side of the stack structure 200 away from the substrate 100 in the process of etching the etch stop layer 400.

In this embodiment, the material of the first hardmask 310 includes aluminum oxide or titanium nitride, and during patterning of the first hardmask 310, a corresponding etchant is selected according to the material of the first hardmask 310. For example, the material of the first hardmask 310 is aluminum oxide, the patterned first hardmask 310 is subjected to dry etching, and the etchant used for dry etching includes boron trichloride and chlorine. In other embodiments, the patterning process of the first hardmask 310 is wet etching.

In addition, the material of the first hardmask 310 is the same as the material of the etch stop layer 400, and the remaining first hardmask 310 on the side of the stack structure 200 away from the substrate 100 can be removed in the process of etching the etch stop layer 400, such that not only the remaining first hardmask 310 is removed, but also no additional process is added, reducing the costs for manufacturing a semiconductor device. The process of etching the etch stop layer 400 is preferably an etching approach with a high etching selection ratio and low etching damage, for example, wet etching, so as to avoid damage or over etching to the stack structure 200 and the film layers under the etch stop layer 400.

In some embodiments, the thickness of the first hardmask 310 is 40% to 70% of the thickness of the etch stop layer 400.

As there is also a certain degree of consumption of the first hardmask 310 in the process of etching the stack structure 200 to form the opening 201, the remaining first hardmask 310 is formed. Setting the thickness of the first hardmask 310 to be 40% to 70% of the thickness of the etch stop layer 400 can ensure that the remaining first hardmask 310 after forming the opening 201 still has a certain thickness, the thickness consumption thereof does not cause a change in a pattern, and the remaining first hardmask 310 can also be completely removed in the process of etching the etch stop layer 400, avoiding over lateral etching on the etch stop layer 400 when isotropic etching (for example, wet etching) is used in order to completely remove the remaining first hardmask 310.

It should be noted that, the material of the first hardmask 310 includes, but is not limited to, aluminum oxide or titanium nitride, and the first hardmask 310 may be made of other materials with a high etching selection ratio for the stack structure 200, as long as the thickness ratio of the first hardmask 310 to the etch stop layer 400 can satisfy that the remaining first hardmask 310 is completely removed in the process of etching the etch stop layer 400.

In some embodiments, both the material of the first hardmask 310 and the material of the etch stop layer 400 are aluminum oxide, the method for etching the etch stop layer 400 and the remaining first hardmask 310 on the side of the stack structure 200 away from the substrate 100 is wet etching, and the etchant includes an aqueous solution of ammonium hydroxide. The ratio of ammonium hydroxide ($NH_4OH$) to deionized water ($H_2O$) is 1:50 to 1:200, and the etching temperature is 30° C. to 80° C. As an example, the ratio of ammonium hydroxide to deionized water is 1:50, 1:100, 1:150, 1:200, and so on, and the etching temperature is 30° C., 40° C., 50° C., 60° C., 70° C., 80° C., and so on. With an aqueous solution of ammonium hydroxide of an appropriate ratio and temperature, the aluminum oxide etch stop layer 400 can be etched, so as to extend the opening 201 to penetrate through the etch stop layer 400, while completely removing the remaining first hardmask 310.

In some embodiments, both the material of the first hardmask 310 and the etch stop layer 400 are titanium nitride, and the etchant for etching the etch stop layer 400 and the remaining first hardmask 310 on the side of the stack structure 200 away from the substrate 100 includes an aqueous solution of ammonium hydroxide and hydrogen peroxide. The ratio of ammonium hydroxide ($NH_4OH$), hydrogen peroxide ($H_2O_2$) and deionized water ($H_2O$) in the aqueous solution of ammonium hydroxide and hydrogen peroxide is 1:(1-10):(1-50). For example, the ratios of ammonium hydroxide, hydrogen peroxide, and deionized water are 1:1:1, 1:1:5, 1:1:50, 1:10:1, 1:10:50, etc.

With an aqueous solution of ammonium hydroxide and hydrogen peroxide, the titanium nitride etch stop layer 400 can be etched, so as to extend the opening 201 to penetrate through the etch stop layer 400, while completely removing the remaining first hardmask 310.

Figure 6:
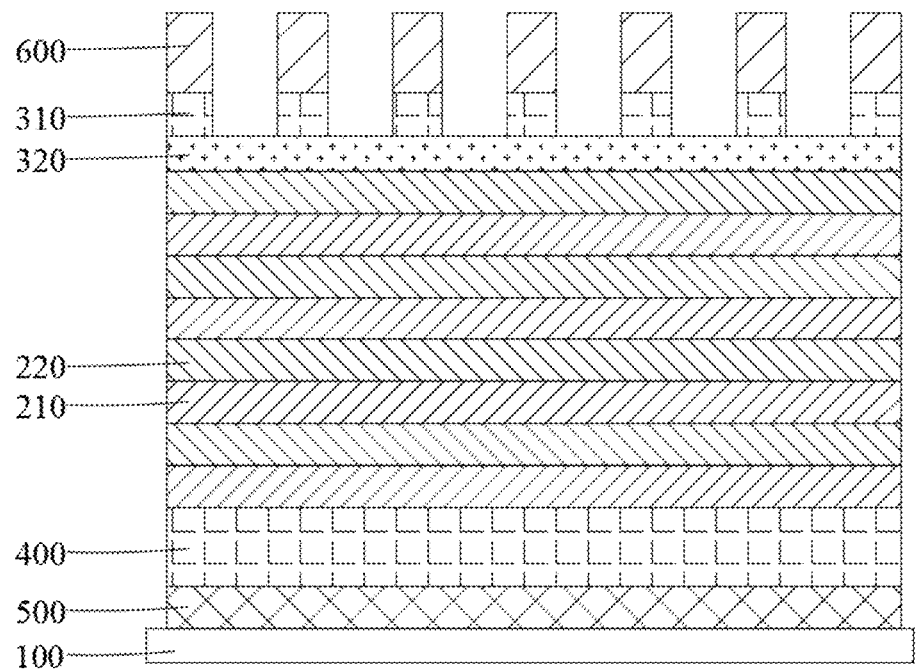
FIG. 6 is a schematic diagram of patterning a first hardmask on a second hardmask according to the embodiment of the present application.
Figure 7:
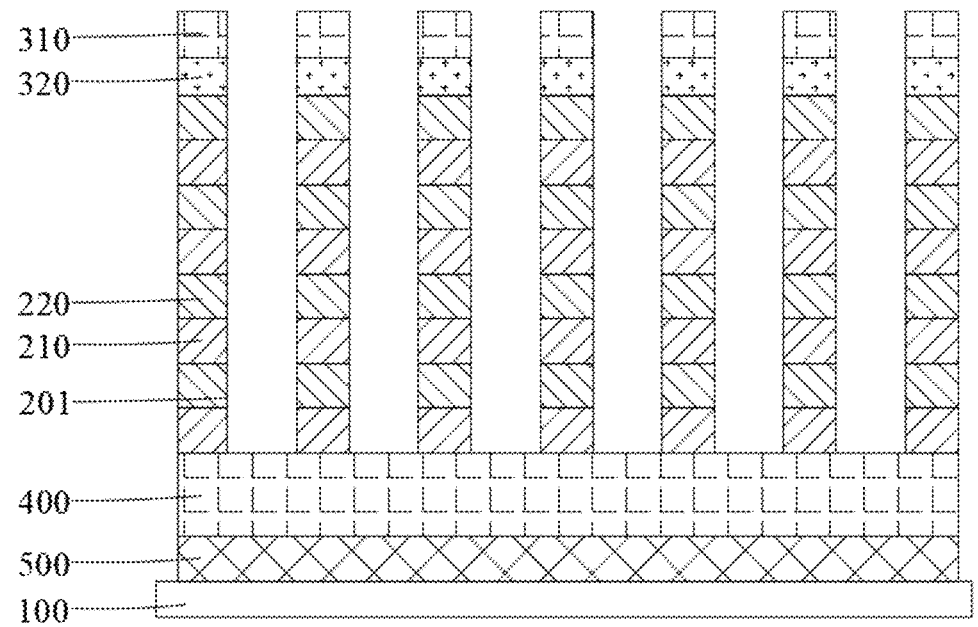
FIG. 7 is a schematic diagram of forming opening penetrating through a second hardmask and a stack structure according to the embodiments of the present application.
Figure 8:
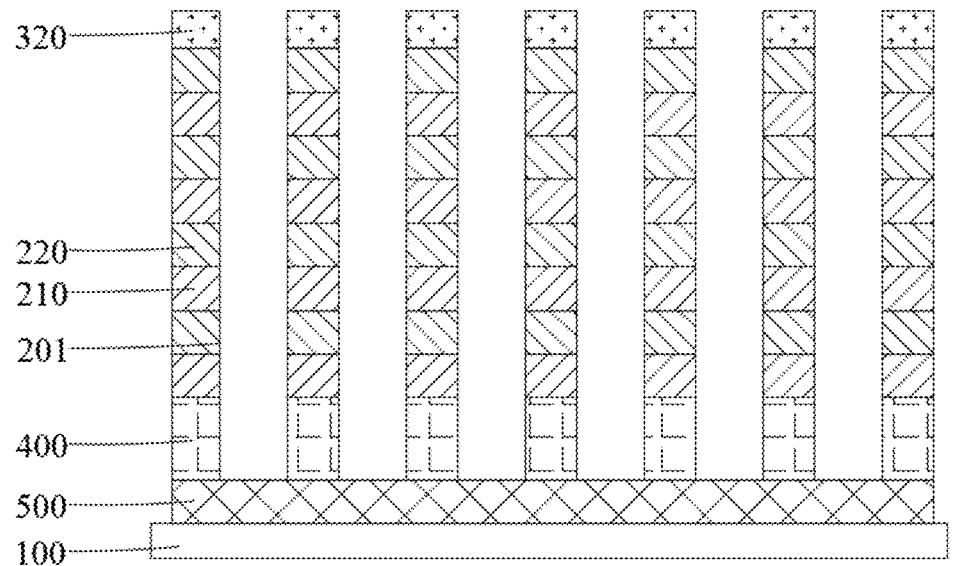
FIG. 8 is a schematic diagram of removing a first hardmask and leaving a second hardmask in the embodiments of the present application.

In another embodiment, as shown in FIG. 6 to FIG. 8, in the step S200 of the method for manufacturing a semiconductor device, forming the patterned hardmask structure further includes:

before forming the first hardmask 310, forming a second hardmask 320 on a side of the stack structure 200 away from the substrate 100, the first hardmask 310 being formed on a side of the second hardmask 320 away from the substrate 100, and the material of the second hardmask 320 being different from the material of the first hardmask 310.

The second hardmask 320 is formed under the first hardmask 310, and as the material of the first hardmask 310 and the material of the second hardmask 320 are different, the first hardmask 310 has an etching selectivity with respect to the second hardmask 320. Thus, when patterning the second hardmask 320 by taking the patterned first hardmask 310 as a mask, the first hardmask 310 can effectively control the vertical profile of the second hardmask 320 under the first hardmask 310; when patterning the stack structure 200 by taking the patterned hardmask structure as a mask, the first hardmask 310 can be effectively control the second hardmask 320 under the first hardmask 310 not to be corroded by the etching for the stack structure 200, which deforms the pattern, thereby preventing the second hardmask 320 from being corroded by the etching to generate over etching by-products and affect the etching profile, and thus forming the more collimated openings 201 of the stack structure 200.

Figure 10:
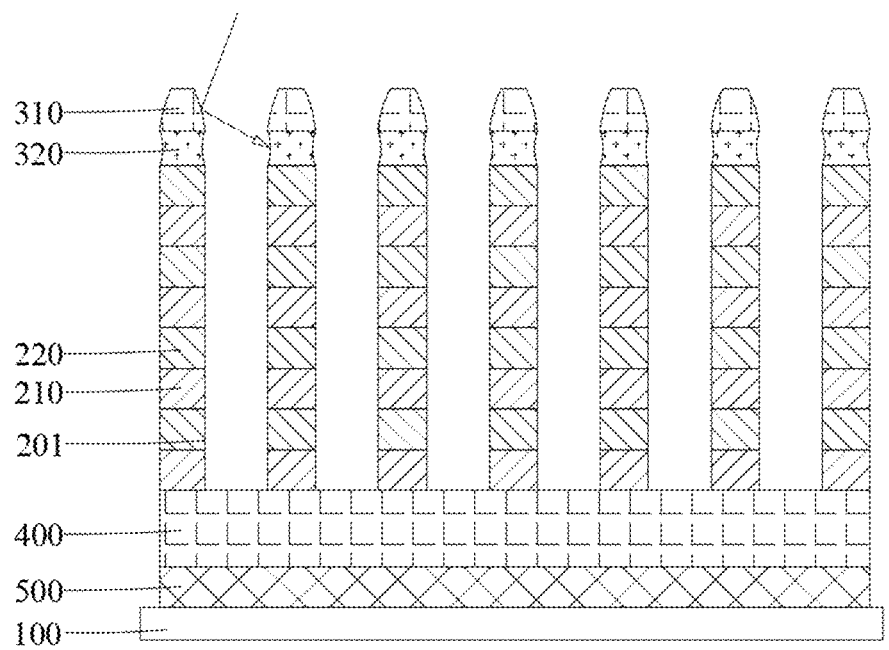
FIG. 10 is a schematic diagram showing an improved morphology of opening of a second hardmask in the embodiments of the present application.

Referring to FIG. 10, when the second hardmask 320 is provided under the first hardmask 310, the etching profile of the top film layer in the stack structure 200 may be further improved. When the first hardmask 310 is etched, resulting in loss of a top corner and a change of a morphology, the etching particles may be undesirably reflected, thereby causing an etching profile under the opening of the first hardmask 310 to be bent; when the second hardmask 320 exists, as the second hardmask 320 has a certain thickness, the undesired reflected etching particles may act on the second hardmask 320 rather than the stack structure 200, thereby reducing an etching morphology defect in a top film layer of the stack structure 200; and as the second hardmask 320 has a certain etching selectivity with respect to the stack structure, the second hardmask 320 is less damaged and has less deformation, and a stable and collimated morphology may be maintained at the opening of the whole hardmask structure, thereby further improving the collimation of the etching profile formed in the stack structure.

It is understood that the second hardmask 320 has a certain thickness. As an example, the thickness of the second hardmask 320 is 50 nm to 1000 nm. The thickness of the second hardmask 320 is greater than an action range of sidewall etching generated by the undesired reflected etching particles, and the thickness range varies according to an actual etching process, that is, when the material of the first hardmask 310 and the thickness thereof and the material of the stack structure 200 and the thickness thereof vary, the material and thickness of the second hardmask 320 are adjusted accordingly. In this embodiment, the thickness of the second hardmask 320 is limited to be greater than 50 nm, which can ensure that the second hardmask 320 can effectively protect the stack structure 200, reduce or eliminate morphology defects of a film layer on the top of the stack structure 200; and the thickness of the second hardmask 320 is limited to be less than 1000 nm, which can avoid an excessive thickness of the second hardmask 320. On the one hand, the increased etching difficulty due to the increased depth-to-width ratio can be avoided, and on the other hand, material consumption for manufacturing the second hardmask 320 can be reduced.

In some embodiments, the second hardmask 320 includes a silicon oxide layer, a silicon nitride layer, polysilicon, Diamond-like Carbon (LDC), an advanced patterning film, a Spin on Hardmask (SOH) or Spin on Carbon (SOC); the material of the stack structure 200 is different from that of the second hardmask 320, that is, the material of the first material layer 210 is different from that of the second hardmask 320, and the material of the second material layer 220 is also different from that of the second hardmask 320.

Referring to FIG. 6 to FIG. 8, the method for manufacturing the semiconductor device further includes:

after removing the remaining first hardmask 310 on the side of the stack structure 200 away from the substrate 100, removing the second hardmask 320. The second hardmask 320 may be removed by wet etching or dry etching, preferably dry etching with a high etching selection ratio.

Thus, undesired damage to the stack structure 200 upon removal of the second hardmask 320 may be avoided. Preferably, the second hardmask 320 includes materials which are easily removed, such as diamond-like carbon, an advanced patterning film, a spin on hardmask, or spin on carbon. The etching gas used in dry etching to remove the second hardmask 320 includes a composition of $O_2$ and $SO_2$, a composition of $O_2$ and COS, a composition of $O_2$ and $CO_2$, or a composition of CO and $CO_2$, etc.

After forming the opening 201 that penetrates through the stack structure 200, the remaining first hardmask 310 and second hardmask 320 on the side of the stack structure 200 away from the substrate 100 are removed, so as to prevent the first hardmask 310 and the second hardmask 320 from affecting other structure arrangements on the side of the stack structure 200 away from the substrate 100.

Figure 9:
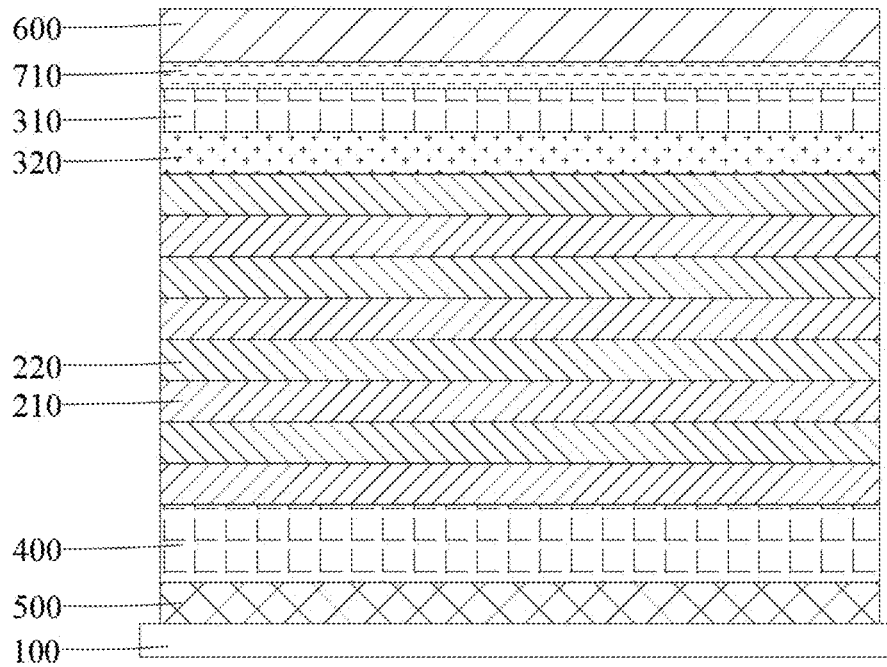
FIG. 9 is a schematic diagram of forming a photoresist layer and an anti-reflective coating layer in the embodiments of the present application.

Referring to FIG. 6 and FIG. 9, the method for patterning the first hardmask 310 includes:

forming a photoresist layer 600 on a side of the first hardmask 310 away from the substrate 100, exposing and developing the photoresist layer 600 to form a patterned photoresist layer 600, and etching the first hardmask 310 using the patterned photoresist layer 600 as a mask to form a patterned first hardmask 310.

The method for manufacturing a semiconductor device further includes:

before forming the photoresist layer 600, forming a bottom anti-reflective coating layer 710 on the side of the first hardmask 310 away from the substrate 100, the photoresist layer 600 being formed on the side of the bottom anti-reflective coating layer 710 away from the substrate 100.

Before forming the photoresist layer 600, the bottom anti-reflective coating layer 710 is formed on the side of the first hardmask 310 away from the substrate 100, and the bottom anti-reflective coating layer 710 can absorb or interfere with reflected light, thereby reducing the influence of the reflected light on exposure, and making the pattern formed by exposure and development of the photoresist layer 600 clearer.

It should be noted that, before the photoresist layer 600 is formed, the bottom anti-reflective coating layer 710 can be formed on the side of the first hardmask 310 away from the substrate 100, but the present application is not limited thereto, the bottom anti-reflective coating layer can also be formed after the photoresist layer 600 is formed, and a top anti-reflective coating layer may be formed on a side of the photoresist layer 600 away from the substrate 100, so as to improve the light incident rate during exposure, depending on specific situations.

The terms of "first," "second" and the like are for descriptive purposes only and cannot be construed as indicating or implying relative importance or implying the number of the indicated technical features. Thus, features defined with "first", "second" and the like may explicitly or implicitly include one or more of the features In the description of the present application, "a plurality of" means two or more, unless explicitly and specifically defined otherwise.

In the present application, unless otherwise explicitly provided and limited, the terms such as "mount," "connect," should be understood broadly, which, for example, may refer to a fixed connection, a detachable connection, or an integral connection; which may refer to a mechanical connection or an electrical connection; which may refer to a direct connection or an indirect connection via an intermediate medium; which may be inner communication of two elements, or may be an interaction relationship between two elements. For those ordinarily skilled in the art, the specific meanings of the above terms in the present application will be understood according to the specific circumstances.

In the content of the description, illustrations of the reference terms "some embodiments", "example", etc. mean that specific features, structures, materials, or characteristics described in connection with the embodiment or example are encompassed in at least one embodiment or example of the present application. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may combine and incorporate different embodiments or examples described in the description and features of different embodiments or examples.

Although embodiments of the present application have been shown and described above, it will be understood that the above-mentioned embodiments are exemplary and cannot be construed as limiting the present application. Those skilled in the art may make changes, variations, alternatives and modifications to the above-mentioned embodiments within the scope of the present application. Therefore, any changes or modifications made in accordance with the claims and descriptions of the present application should fall within the scope of the present application.

What is claimed is:

1. A method for manufacturing a semiconductor device, comprising:

forming an etch stop layer on a substrate;

forming, on the substrate, a pair of film layers stacked in a vertical direction to form a stack structure, wherein the stack structure is formed on a side of the etch stop layer away from the substrate; wherein the pair of film layers comprise a first material layer and a second material layer sequentially stacked in the vertical direction, the first material layer is an isolation material layer, and the second material layer is a sacrificial material layer or a conductive material layer;

forming a patterned first hardmask on a side of the stack structure away from the substrate, wherein a thickness of the first hardmask is 40% to 70% of a thickness of the etch stop layer; wherein a material of the first hardmask comprises aluminum oxide or titanium nitride, the material of the first hardmask is the same as the material of the etch stop layer;

etching the stack structure by using the patterned first hardmask as a mask, to form an opening that penetrates through the stack structure;

etching the etch stop layer to make the opening extend to penetrate through the etch stop layer, removing remaining first hardmask on the side of the stack structure away from the substrate in a process of etching the etch stop layer;

before forming the first hardmask, forming a second hardmask on the side of the stack structure away from the substrate, wherein the first hardmask is formed on a side of the second hardmask away from the substrate, a thickness of the second hardmask is 50 nm to 1000 nm, and the material of the second hardmask is different from the material of the first hardmask; and wherein the second hardmask comprises a silicon oxide layer, a silicon nitride layer, diamond-like coating layer, and the material of the first material layer and the material of the second material layer are different from the material of the second hardmask.

2. The method for manufacturing the semiconductor device according to claim 1, wherein the material of the first hardmask and the material of the etch stop layer are aluminum oxide, and an etchant for etching the etch stop layer and the remaining first hardmask on the side of the stack structure away from the substrate comprises an aqueous solution of ammonium hydroxide.

3. The method for manufacturing the semiconductor device according to claim 1, wherein the material of the first hardmask and the material of the etch stop layer are titanium nitride, and an etchant for etching the etch stop layer and the remaining first hardmask on the side of the stack structure away from the substrate comprises an aqueous solution of ammonium hydroxide and hydrogen peroxide.

4. The method for manufacturing the semiconductor device according to claim 3, wherein a ratio of the ammonium hydroxide, the hydrogen peroxide and deionized water in the aqueous solution of ammonium hydroxide and hydrogen peroxide is 1:(1-10):(1-50).

5. The method for manufacturing the semiconductor device according to claim 3, wherein a ratio of the ammonium hydroxide to deionized water is 1:50 to 1:200, and an etching temperature is 30° C. to 80° C.

6. The method for manufacturing the semiconductor device according to claim 1, further comprising:
- after removing the remaining first hardmask on the side of the stack structure away from the substrate, removing the second hardmask by using dry etching.

7. The method for manufacturing the semiconductor device according to claim 1, wherein patterning the first hardmask comprises:
- forming a photoresist layer on a side of the first hardmask away from the substrate, patterning the photoresist layer, and etching the first hardmask by using the patterned photoresist layer as the mask to form the patterned first hardmask;
- and the method for manufacturing the semiconductor device further comprises:
- before forming the photoresist layer, forming a bottom anti-reflective coating layer on the side of the first hardmask away from the substrate, wherein the photoresist layer is formed on a side of the bottom anti-reflective coating layer away from the substrate; or
- after forming the photoresist layer, forming a top anti-reflective coating layer on a side of the photoresist layer away from the substrate.

\* \* \* \* \*